United States Patent
Vogt et al.

(10) Patent No.: US 9,997,466 B2
(45) Date of Patent: *Jun. 12, 2018

(54) INTEGRATED CIRCUIT STACK INCLUDING A PATTERNED ARRAY OF ELECTRICALLY CONDUCTIVE PILLARS

(71) Applicant: Honeywell International Inc., Morris Plains, NJ (US)

(72) Inventors: Eric E. Vogt, Independence, MN (US); Gregor D. Dougal, Minneapolis, MN (US); James L. Tucker, Clearwater, FL (US)

(73) Assignee: Honeywell International Inc., Morris Plains, NJ (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/352,405

(22) Filed: Nov. 15, 2016

(65) Prior Publication Data

US 2017/0125352 A1 May 4, 2017

Related U.S. Application Data

(63) Continuation of application No. 14/692,154, filed on Apr. 21, 2015, now Pat. No. 9,548,277.

(51) Int. Cl.
*H01L 23/538* (2006.01)
*H01L 21/48* (2006.01)

(52) U.S. Cl.
CPC ........ *H01L 23/5389* (2013.01); *H01L 21/486* (2013.01); *H01L 21/4853* (2013.01); *H01L 21/4857* (2013.01); *H01L 23/5383* (2013.01); *H01L 23/5384* (2013.01); *H01L 23/5386* (2013.01)

(58) Field of Classification Search
CPC ................... H01L 2924/0665; H01L 23/5226
See application file for complete search history.

(56) References Cited

U.S. PATENT DOCUMENTS

| | | | |
|---|---|---|---|
| 5,579,207 | A | 11/1996 | Hayden et al. |
| 5,657,537 | A | 8/1997 | Saia et al. |
| 6,319,740 | B1 | 11/2001 | Heffner et al. |
| 6,916,719 | B1 | 7/2005 | Knight et al. |
| 7,253,512 | B2 | 8/2007 | Powell |
| 7,260,890 | B2 | 8/2007 | White et al. |
| 7,439,840 | B2 | 10/2008 | Carastro et al. |
| 7,701,244 | B2 | 4/2010 | Bartley et al. |
| 7,709,943 | B2 | 5/2010 | Michaels |
| 7,730,613 | B2 | 6/2010 | Vasoya |

(Continued)

OTHER PUBLICATIONS

Nguyen, "Through Silcon via Research Project," retrieved from http://web.cecs.pdx.edu/~jmorris/ECE%20414%20&%20514 %20Electronics%20Packaging/Projects/TSVs%20Anbinh %20Nguyen%20report.pdf on Feb. 28, 2012, 9 pp.

(Continued)

*Primary Examiner* — Tran Tran
(74) *Attorney, Agent, or Firm* — Shumaker & Sieffert, P.A.

(57) ABSTRACT

The present disclosure describes a stacked integrated circuit system that includes two integrated circuit layers stacked on opposite sides of an interposer layer. The interposer layer may include at least one integrated circuit die and an interposer portion that includes a plurality of electrically conductive pillars arranged in a laterally patterned array within the interposer layer.

20 Claims, 4 Drawing Sheets

(56) References Cited

U.S. PATENT DOCUMENTS

| | | |
|---|---|---|
| 7,884,625 B2 | 2/2011 | Bartley et al. |
| 7,952,478 B2 | 5/2011 | Bartley et al. |
| 7,989,918 B2 | 8/2011 | Bartley et al. |
| 8,183,087 B2 | 5/2012 | Lin et al. |
| 8,208,279 B2 | 6/2012 | Lue |
| 8,431,828 B2 | 4/2013 | Vanfleteren et al. |
| 8,461,464 B2 | 6/2013 | Nakamura |
| 8,716,873 B2 | 5/2014 | Wang et al. |
| 8,749,337 B2 | 6/2014 | Baram et al. |
| 8,778,124 B2 | 7/2014 | Rendek, Jr. et al. |
| 8,824,159 B2 | 9/2014 | Leedy |
| 2008/0129501 A1 | 6/2008 | Tucker et al. |
| 2009/0127667 A1 | 5/2009 | Iwata |
| 2010/0026337 A1 | 2/2010 | Bartley et al. |
| 2010/0031376 A1 | 2/2010 | Bartley et al. |
| 2011/0102011 A1 | 5/2011 | Van der Plas et al. |
| 2011/0119322 A1 | 5/2011 | Li et al. |
| 2013/0235544 A1 | 9/2013 | Tucker et al. |
| 2014/0192498 A1 | 7/2014 | Rathburn |
| 2015/0130082 A1* | 5/2015 | Lu .................. H01L 21/561 |
| | | 257/777 |
| 2015/0279814 A1* | 10/2015 | Hurwitz ................ H01L 23/481 |
| | | 257/774 |
| 2015/0348904 A1* | 12/2015 | Huang .............. H01L 21/76802 |
| | | 257/774 |
| 2016/0315055 A1 | 10/2016 | Vogt et al. |

OTHER PUBLICATIONS

"Vertical-Die-Stacking-Goes-3D-Without-TSV," Electro IQ, retrieved from http://www.electroiq.com/articles/ap/2010/10/vertical-die-stacking-goes on Sep. 27, 2011, 3 pp.

Lau et al., "Feasibility Study of a 3D IC Integration System-in-Packaging (SiP) from a 300mm Multi-Project Wafer (MPW)," 44th International Symposium on Microelectronics, Oct. 9-13, 2011, 9 pp.

Banijamali et al., "Quality and Reliability of 3D TSV Interposer and Fine Pitch Solder Micro-Bumps for 28nm Technology," 44th International Symposium on Microelectronics, Oct. 9-13, 2011, 4 pp.

Prosecution History from U.S. Appl. No. 14/692,154, dated from Dec. 31, 2015 through Nov. 9, 2016, 42 pp.

* cited by examiner

INTEGRATED CIRCUIT STACK INCLUDING A PATTERNED ARRAY OF ELECTRICALLY CONDUCTIVE PILLARS

This application is a continuation of pending U.S. application Ser. No. 14/692,154, filed on Apr. 21, 2015, entitled INTEGRATED CIRCUIT STACK INCLUDING A PATTERNED ARRAY OF ELECTRICALLY CONDUCTIVE PILLARS, the entire contents of which are hereby incorporated by reference in its entirety.

TECHNICAL FIELD

The disclosure relates to stacked integrated circuit systems including an integrated circuit die.

BACKGROUND

In some examples, integrated circuit components may be vertically stacked to save space. In some examples, the stacked integrated circuit components may be packaged in a single package and electrically coupled to a printed board.

SUMMARY

In general, the present disclosure describes a stacked integrated circuit system that includes two integrated circuit layers stacked on opposite sides of the interposer layer. The interposer layer may include one or more integrated circuit die (e.g., one or more application-specific integrated circuit die) and an interposer portion that includes a plurality of electrically conductive pillars arranged in a patterned array laterally within the interposer layer. Each electrically conductive pillar of the plurality of electrically conductive pillars is oriented so the pillar extends through the interposer layer and contacts the two integrated circuit layers stacked on opposite sides of the interposer layer. In some examples, the two integrated circuit layers have a plurality of interconnect elements configured to create at least one electrical pathway that transmits through the interposer layer using at least one of the plurality of electrically conductive pillars and electrically connects the two integrated circuit layers. Each pillar in the plurality of electrically conductive pillars may also be substantially encircled laterally within the interposer layer by a filler material that physically isolates each respective electrically conductive pillar from the rest of the plurality of electrically conductive pillars.

In some examples, at least one integrated circuit die may be electrically coupled to one of the integrated circuit layers through interconnect elements, e.g., electrically conductive traces, electrically conductive vias, or both, of the adjacent integrated circuit layer. At least one integrated circuit die may also be electrically connected to other integrated circuit layers of the stacked integrated circuit system using the plurality of electrically conductive pillars in the interposer portion.

In some examples, the disclosure describes a system including a first integrated circuit layer comprising a first plurality of interconnect elements; a second integrated circuit layer comprising a second plurality of interconnect elements; and an interposer layer between the first and second integrated circuit layers. The first and second integrated circuit layers and the interposer layer may be stacked in the z-axis direction. The interposer layer may include an interposer portion including a filler material and a plurality of electrically conductive pillars extending in the z-axis direction. The plurality of electrically conductive pillars may form a patterned array in an x-y plane substantially normal to the z-axis direction. In some examples, each electrically conductive pillar of the plurality of electrically conductive pillars is substantially encircled in the x-y plane by the filler material, at least one electrically conductive pillar of the plurality of electrically conductive pillars is configured to electrically communicate with at least one interconnect element of the first plurality of interconnect elements and at least one interconnect element of the second plurality of interconnect elements. The interposer layer also may include a first integrated circuit die adjacent to the interposer portion and between the first and second integrated circuit layers.

In some examples, the disclosure describes a method including mounting a first integrated circuit die on a top surface of a first integrated circuit layer. The first integrated circuit die and first integrated circuit layer may be stacked in a z-axis direction, and the first integrated circuit may electrically communicate with the first integrated circuit layer. The method may also include forming an interposer portion on an exposed part of the top surface of the first integrated circuit layer, adjacent to the first integrated circuit die. The interposer portion may include a plurality of electrically conductive pillars that extend in the z-axis direction and form a patterned array in an x-y plane substantially normal to the z-axis direction. Each electrically conductive pillar of the plurality of electrically conductive pillars may be substantially encircled in the x-y plane by a filler material. At least one of the plurality of electrically conductive pillars may be configured to electrically communicate with the first integrated circuit layer. In some examples, the method may also include stacking a second integrated circuit layer on the interposer portion, where the first and second integrated circuit layers are substantially parallel to each other and the first integrated circuit is between the first and second integrated circuit layers.

The details of additional examples are set forth in the accompanying drawings and the descriptions below. Other features, objects, and advantages of the disclosure will be apparent from the description and drawings, and from the claims.

DETAILED DESCRIPTION

Figure 1:
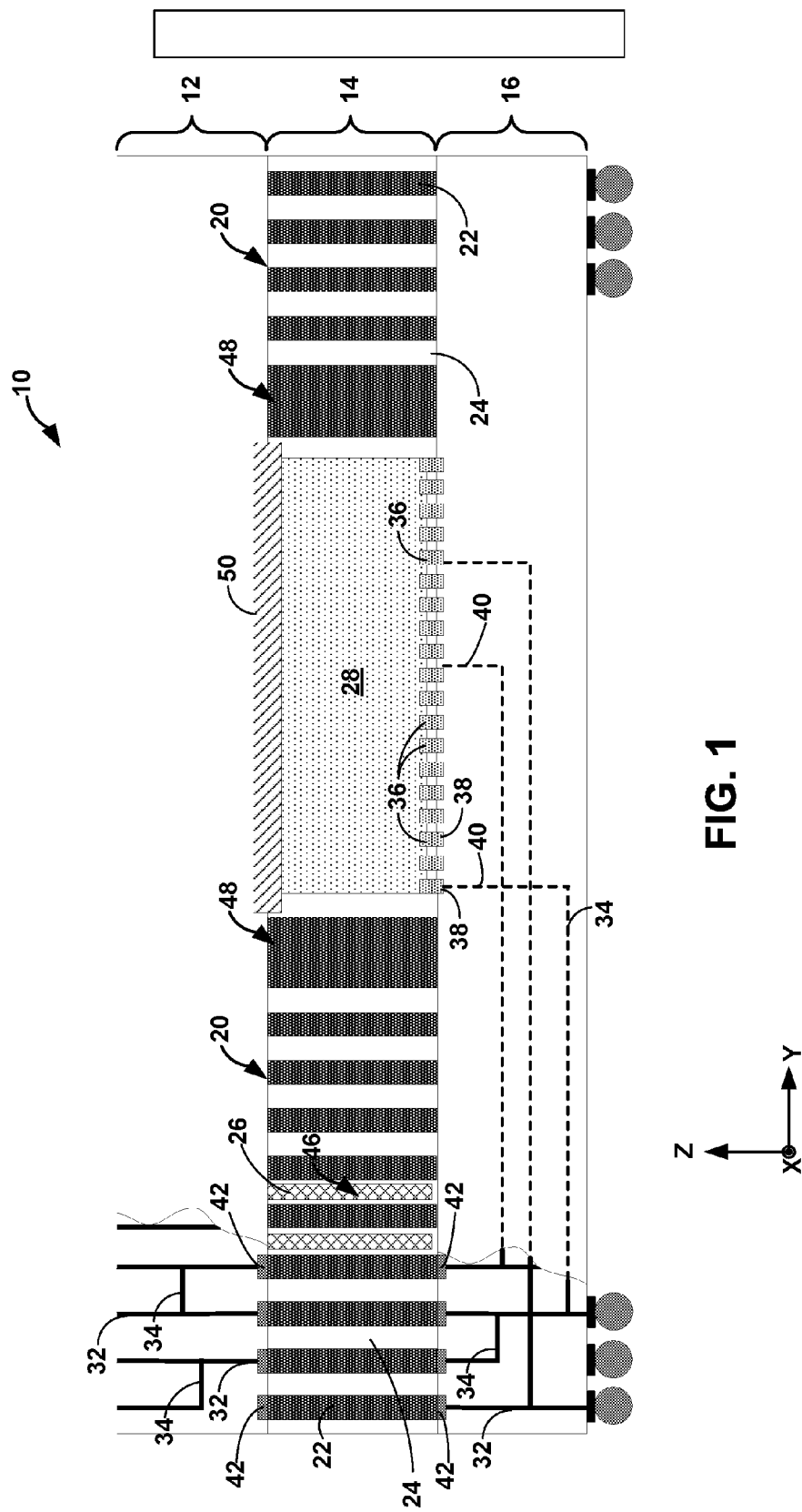
FIG. 1 is a cross-sectional conceptual and schematic diagram illustrating a stacked integrated circuit system that includes two vertically-stacked integrated circuit layers and an interposer layer.

Stacked arrangements of integrated circuits (IC) have become increasingly useful in terms of reducing space consumption and embedding or encapsulating IC die to protect the IC die and deter reverse engineering of the IC die. The present disclosure describes a stacked IC system that includes an interposer layer positioned between a first and second IC layers. The interposer layer may include at least one IC die and an interposer portion that includes a plurality of electrically conductive pillars arranged in a patterned array throughout the interposer portion. In some examples, the interposer portion substantially surrounds the IC die, thereby, in combination with the first and second IC layers, substantially encapsulating the ID die within the stacked IC system.

Encapsulating one or more IC die within the stack may help protect the IC die from tampering. For example, in examples in which the IC die includes proprietary or sensitive information or configurations, encapsulating the IC die within the stacked IC system may provide increased security and prevent or reduce the risk of reverse engineering of the IC die. The surrounding IC layers and interposer portion may hinder physical access to the IC die. In addition, critical interconnects between an IC die and the other IC layers, IC dice, and interposer layer may also be secured within the inner layers of the stacked IC system, which may further inhibit access to information that may be useful for reverse engineering the stacked IC system. For example, an adversary may have more difficulty sampling the power consumption of an IC die when the electrical interconnects between an IC die and other components (e.g., an off-chip memory provided by another IC die of the system) are secured within the inner layers of the stacked IC system and not exposed. Power consumption may be one parameter used by an adversary to gain information about the stacked IC system in a type of attack referred to as a side channel attack.

The stacked IC systems described in the disclosure may also provide other advantages. For example, the patterned array of electrically conductive pillars may provide added reliability benefits compared to alternative stacked arrangements of IC systems. For example, mechanical stress generated by thermal expansion and coefficient of thermal expansion (CTE) mismatches between materials or adjacent layers can lead to physical deformation and cause premature failure. In some examples, forming a patterned array of electrically conductive pillars throughout the interposer layer may reduce mechanical stresses in the IC system resulting from CTE mismatches. In some examples, the presence of the plurality of electrically conductive pillars may assist in dissipating heat within the stack IC system.

In some examples, the plurality of electrically conductive pillars may increase the reliability of the system. For example, reliability benefits may be achieved by implementing redundant electrical connections using the plurality of electrically conductive pillars to improve yield. The IC system may be configured to permit a certain degree of faults while still maintaining normal operations. In some examples, the redundant electrical connections using the plurality of electrically conductive pillars may be used to monitor the IC system to determine if physical damage or other faults have occurred.

In some examples of the disclosure, each pillar of the plurality of electrically conductive pillars is substantially encircled within the interposer layer by a filler material that can be electrically conductive or electrically non-conductive. The electrically non-conductive filler material may be used to electrically isolate pillars in the plurality of electrically conductive pillars from one another and provide structural support for the interposer portion. The conductive filler material may be used in some examples to create electrical networks, e.g., electrical webs, within the interposer layer. The electrical webs may be beneficial to encircle and electrically shield components within the interposer layer.

The stacked IC systems described herein may facilitate incorporation of IC die that otherwise may not be used in stacked IC assemblies because the IC die do not include through-vias, e.g., third party or off-the-shelf IC components. In this way, the stacked IC systems described herein may facilitate manufacturing of more application-specific assemblies because, in some examples, an IC die may be incorporated into the IC systems without requiring substantial or any reconfiguration or customization of the configuration of the IC die (e.g., the addition of certain types of electrical interconnects, such as through-vias). In some examples, an IC die of the stacked IC system may be electrically coupled (e.g., via one or more electrical contacts) to an adjacent IC layer, which may be electrically connected to the interposer portion via respective electrically conductive vias and traces in the adjacent IC layer.

FIG. 1 is a cross-sectional conceptual and schematic diagram of an example stacked IC system 10 that includes vertically-stacked IC layers 12 and 16 separated by an interposer layer 14. IC layers 12 and 16 and interposer layer 14 are stacked, e.g., arranged, in the z-axis direction, (orthogonal x-y-z axes are shown in FIG. 1 and in the other figures merely for ease of description), such that IC layers 12 and 16 and the interposer layer are substantially planar, with each of layers 12, 14, and 16 forming a separate plane. As used in the disclosure, a layer may define a substantially planar surface (e.g., planar or nearly planar but for processing variations) in some examples. In the example shown in FIG. 1, each of layers 12, 14, and 16 are shown as having the same dimensions and configurations (e.g., shape). In other examples, however, one or more of layers 12, 14, and 16 may have a different size or shape than at least one other of layers 12, 14, and 16, such that the layers 12, 14, and 16 are stacked, but at least two layers of layers 12, 14, and 16 are partially offset from each other due to the different configurations or dimensions.

In the example illustrated in FIG. 1, interposer layer 14 includes an interposer portion 20 and IC die 28. In some examples, interposer portion 20 may substantially encircle (e.g., completely or nearly completely surrounds in a cross-section taken along an x-y plane orthogonal to the z-axis) IC die 28. In this way, IC layer 12, interposer portion 20, and IC layer 14 may completely encapsulate IC die 28 within stacked IC system 10, thereby preventing outside access to IC die 28. In some examples, IC die 28 may not visibly exposed (to the human eye) such that an intruder cannot visually ascertain where IC die 28 is located within IC system 10, what type of IC die 28 is included in the system 10, or the configuration of the electrical connections of IC die 28 without further physical tampering with system 10 to expose IC die 28. In some examples, encapsulating IC die 28 within the stacked IC system 10 may help reduce or even prevent interception of electrical signals (during a tamper event) transmitted by IC die 28 within stacked IC system 10, which could provide insight into the components and capabilities of system, e.g., to a reverse engineering.

IC layers 12 and 16 may include a plurality of interconnect elements. Interconnect elements of IC layers 12 and/or 16 may include, for example, vias 40, through-vias 32, traces 34, electrical contacts 38 and 42, passive circuit elements (e.g., passive resistors, inductors, and capacitors), active circuit elements, metal layers, logic circuits, or other conductive elements positioned within IC layers 12 and/or 16. The plurality of interconnect elements, e.g., vias 32 and 40, traces 34, electrical contacts 38 and 42, and the like, may be defined by any suitable electrically conductive material which facilitates electrical communication, such as tungsten, molybdenum, copper, aluminum, silver, or gold.

As described herein, the interconnect element form electrically conductive pathways, e.g., vias 32, 40, and traces 34 extending within the respective IC layers 12 and 16. Vias 32 and 40 and traces 34 are configured to transmit electrical signals within the respective IC layers 12 and 16. As shown in FIG. 1, vias 32 and 40 are configured to route signals in a direction generally in the z-axis direction, and electrically conductive traces 34 are configured to route electrical signals in other directions, such as in directions generally parallel to the x-y plane. Vias 32 are illustrated as through-vias, configured to transmit electrical signals between the interposer layer 14 and other IC layers (not shown in figure) adjacent to either IC layer 12 or 16.

As described herein, IC layers 12 and 16 include interconnect elements (e.g., vias 32, 40 and traces 34) configured to transmit electrical signals through system 10 in order to provide electrical communication between interposer portion 20 and IC layers 12 and 16 and electrical communication with IC die 28. Although the examples illustrated herein portray IC layers 12 and 16 as including through-vias 32 extending substantially through the respective IC layers, in some examples, IC layers 12 and/or 16 may not include through-vias 32. Instead, IC layers 12 and 16 may include other interconnect elements configured to transmit, condition, and/or process electrical signals within the respective IC layer 12 or 16, and to provide communication with IC die 28.

In some examples, IC die 28 may be connected to IC layers 12 and 16 using the plurality of interconnect elements (e.g. contact pads 38, vias 32, 40, traces 34, and the like) within the IC layers 12, 16 and using the plurality of electrically conductive pillars 22 of the interposer portion 20. In the example shown, IC die 28 includes electrical contacts 36 positioned on a surface and configured to be electrically coupled to electrical contacts 38 positioned on a surface of IC layer 16. (In FIG. 1, only some of electrical contacts 36 and 38 are denoted, for clarity of illustration.) The adjacent electrical contacts 36 and 38 of IC system 10 may be coupled to one another using any suitable technique such as, for example, connecting electrical contacts via flip-chip-bonding, direct metal bonding, thermal compression bonding, or an oxide bonding technique.

In some examples, at least some of electrical contacts 38 of IC layer 16 are electrically coupled to electrically conductive vias 40 (illustrated by hidden lines in FIG. 1), which are electrically coupled to respective electrically conductive traces 34. Electrically conductive traces 34 each electrically connect electrically conductive vias 40 to through-vias 32, which electrically connect to communicate with the plurality of electrically conductive pillars 22 of interposer portion 20 through respective electrical contacts 42. Electrically conductive pillars 22 may also be connected to vias 32 and traces 34 of IC layer 12 through respective electrical contacts 42. In such a configuration, IC die 28 is able to electrically communicate with both IC layers 12 and 16 through the electrically conductive pillars 22 of interposer portion 20.

Through vias 32 may provide front-side to back-side connections for IC layers 12 and 16, respectively. For example, as illustrated in FIG. 1, the through-vias 32 located in IC layers 12 and 16 connect to the plurality of electrically conductive pillars 22 through electrical contacts 42 located along the surfaces of IC layers 12 and 16 at their respective interface with interposer portion 20. The electrical contacts 42 are positioned to align with the plurality of electrically conductive pillars 22.

In some examples, although not shown in FIG. 1, a surface of the IC die 28 adjacent to IC layer 12 may also include electrical contacts or pads, in addition to or as an alternative to IC die 28 adjacent to IC layer 16 including electrical contacts 36. In some of these examples, traces 34 and vias 32 within IC layer 12, may facilitate electrical connection and communication between the top surface of the IC die 28 and other parts or layers of stacked IC system 10 (e.g., sending electrical signals through the plurality of electrically conductive pillars 22). In this way, IC die 28 may include input and output for electrical signals on multiple sides of the die while not requiring vias extending substantially therethrough. In some examples, the plurality of electrically conductive pillars 22 of interposer portion 20 provide means for electrical communication between IC die 28 and IC layer 12 that may ordinarily be provided by through-vias of IC die 28. Thus, while IC die 28 may include through-vias, they are not necessary to be incorporated into the z-axis stacked configuration of system 10.

In some examples, IC layers 12 and 16 may be custom IC layers, e.g., custom semiconductor devices. For example, IC layer 12 and IC layer 16 may be selected or formed to have a particular function based on the application for which IC system 10 is intended. In some examples, IC layer 12 and/or IC layer 16 may be formed with particular thermal properties such that the layers may help dissipate heat generated by components of IC system 10, such as IC die 28. As another example, IC layer 12 and/or IC layer 16 may be configured to also help shield IC die 28 from EMI (e.g., radio frequency interference) or provide tamper resistant features. As yet another example, IC layer 12 and/or IC layer 16 may include one or more termination resistors that may reflect electrical signals that may cause interference.

Although several examples are described, IC layers 12 and 16 may be formed with any properties suitable for the particular application for which IC system 10 is intended. For example, in some examples, IC layers 12 and 16 may include an analog interposer chip, a microelectromechanical system (MEMS), an inertial sensor, a magnetic sensor, an electro-magnetic sensor, a chemical sensor, a biological sensor, an acoustic sensor, an optical sensor, a radiation sensor, a radio-frequency (RF) link, a power resource, dynamic random access memory (DRAM), a field programmable gate array (FPGA), a parallel computing resource, or any combination thereof.

IC layers 12 and 16, including electrically conductive vias 32, 40 and traces 34 extending therethrough and within, may be formed using any suitable technique. For example, IC layers 12 and 16 may be formed using any suitable semiconductor processing technique. The semiconductor processing may be used to define the electrically conductive vias 32, 40 and electrically conductive traces 34 in IC layers 12 and 16 within a semiconductor material (e.g., silicon). In addition, in examples in which IC layers 12 and 16 include semiconductor components, such as transistors in a semiconductor, the components may be formed using the semiconductor processing techniques (e.g., as part of front-end-of-line (FEOL) processing).

In some examples, vias 32, 40 and traces 34 are formed as part of the back end-of-line (BEOL) processing part of an IC fabrication step. For example, a plurality of metal layers may be deposited onto a substrate (e.g., an active semiconductor layer) using planar copper dual damascene interconnect technology, tungsten polished local interconnect technology, or planarized subtractive aluminum interconnect technology, or some combination of these techniques.

In some examples, passive elements configured to condition electrical signals within the stack may be positioned within one or both of IC layers 12 and 16 during fabrication. For example, one or both of IC layers 12 and 16 may be formed to include one or more passive resistors, inductors, capacitors, or any combination thereof, which are configured to manipulate signals such that the signals are satisfactory for a subsequent stage of processing. As an example, resistive elements within one or both IC layers 12 and 16 may be used to pull unused logic circuit inputs to particular states and to achieve particular impedance effects.

In some examples, IC die 28 may be mechanically coupled to IC layer 12 via an adhesive bond 50 positioned on a surface of the IC die 28 opposite the electrical contacts 36. Adhesive bond 50 may be, for example, positioned on a semiconductor substrate side of IC die 28 in examples in which IC die 28 is fabricated from a semiconductor wafer. Adhesive bond 50 may comprise any suitable adhesive material configured to mechanically couple IC die 28 to one or more adjacent layers in system 10. For example, adhesive bond 50 may comprise an SU-8 adhesive, a benzocyclobutene adhesive, or another adhesive that utilizes free-radical, non-condensation-based organic reactions (e.g., an adhesive that does not include ions, water, alcohols, or corrosives). Adhesive bond 50 may be applied to IC die 28 using any suitable adhesive bonding technique. Although an adhesive bond 50 is described herein, in other examples, system 10 may include another type of wafer bond to mechanically couple IC die 28 to adjacent layers of system 10. For example, in some examples, thermal compression bonding (e.g., copper-to-copper thermal compression bonding, eutectic alloy bonding, or oxide bonding) may be utilized to mechanically couple IC die 28 to adjacent layers in system 10.

Figure 2A:
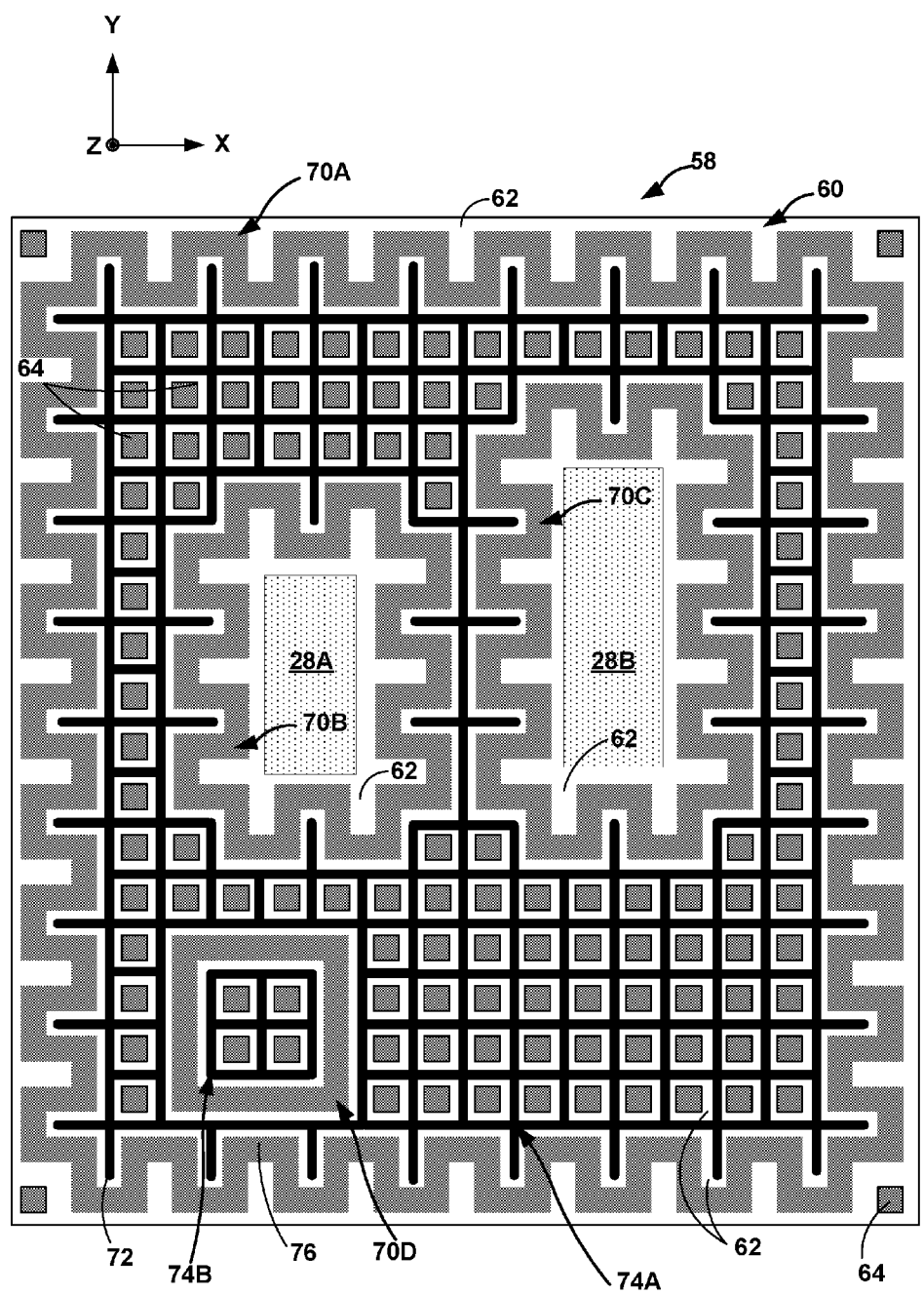
FIG. 2A is a top view conceptual and schematic diagram illustrating an interposer layer showing two integrated circuit dice substantially encircled by an interposer portion.

In some examples, a plurality of IC die 28 may be incorporated into the interposer layer 14 and positioned in a common plane, such as the arrangement of IC dice 28A and 28B shown in FIG. 2A. In the example illustrated in FIG. 2A, IC dice 28A and 28B are not adjacent or aligned within an interposer layer 58. In other examples, the plurality of IC dice 28A, 28B may be positioned adjacent or aligned with one another in interposer layer 58.

In some examples, IC die 28 may be configured for various signal processing tasks, which may be specific to the application for which IC system 10 is used. Accordingly, the type of IC die 28 included in system 10 may vary depending on the intended application. For example, IC die 28 may include one or more die configured for one or more of processing (e.g., co-processor or microprocessor die), memory (e.g., random access memory (RAM) or non-volatile memory (NVM)), power conditioning, ambient monitoring (e.g., temperature and/or health monitoring), sensing, encryption, optics-photonics, or non-volatile memory. As additional examples, IC die 28 may include radio-frequency IC devices, radiation-hardened devices, microelectromechanical systems (MEMS), or any combination thereof.

In some examples, IC die 28 may include an IC die that is not inherently configured for vertical stacking, e.g., that do not include through-vias extending completely through the thickness of the die (measured in the z-axis direction in the example shown in FIG. 1). In this way, the IC die 28 need not be custom made to be incorporated into system 10 and, instead, may be third party IC die and selectively incorporated based on a particular application for which system 10 is intended.

In some examples, IC die 28 may be processed to be substantially planar (e.g., planar or nearly planar), which may facilitate formation of a substantially planar interposer layer 14 to assist in stacking of IC layer 16. In some examples, a third party IC die may be procured in wafer form and subsequently processed for incorporation into IC system 10.

As shown in FIG. 1, interposer layer 14 includes a plurality of electrically conductive pillars 22 within interposer portion 20. The plurality of electrically conductive pillars 22 are oriented such that the longitudinal axis of each pillar of electrically conductive pillars 22 is substantially parallel (e.g., parallel or nearly parallel) to the z-axis direction in FIG. 1. Each electrically conductive pillar of electrically conductive pillars 22 extends substantially through the thickness of interposer layer 14 in the z-axis direction, forming part of an upper and lower surface of interposer portion 20. In some examples, at least some electrically conductive pillars of the plurality of electrically conductive pillars 22 may contact and electrically communicate with one or both of IC layers 12 and 16. In this way, at least some electrically conductive pillars of the plurality of electrically conductive pillars 22 may transmit electrical signals between IC layers 12 and 16 through interposer layer 14, thereby providing some interconnection circuitry for system 10.

The lateral cross-section of the plurality of electrically conductive pillars 22 (i.e., the cross-section in a plane parallel to the x-y plane in FIG. 1) can be of any useful shape including, for example, square, rectangular, circular, elliptical, hexagonal, or the like. The lateral cross-sectional dimension (e.g., width, approximate width, diameter, or approximate diameter) of the electrically conductive pillars 22 may be sufficiently large to help reduce mechanical stress within the interposer portion 20 associated with thermal expansion or CTE mismatch. In some examples electrically conductive pillars 22 may have a cross-sectional dimension of about 30 μm.

Figure 2B:
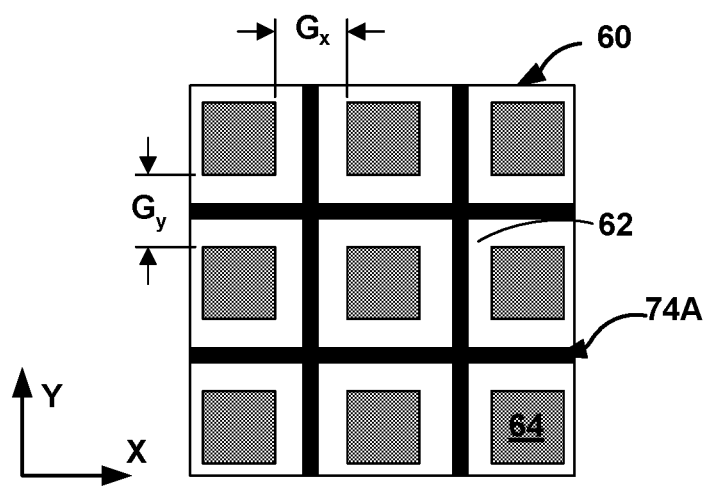
FIG. 2B is an enlarged view of a portion of FIG. 2A showing a gap distance between adjacent electrically conductive pillars.

Electrically conductive pillars 22 may be arranged in a patterned array in the x-y plane of FIG. 1. The patterned array can include any useful arrangement. In some examples, the patterned array may include with a substantially consistent and repeating pattern extending in the x-y plane. For example, in the patterned array may be in the form of a grid (e.g., square or rectangular), hexagonal arrangement, octagonal-square arrangement, or the like. By way of example, FIGS. 2A and 2B show a grid array that includes a plurality of electrically conductive pillars 64 having a square-shaped lateral cross-section and arranged in a square grid. Arranging the plurality of electrically conductive pillars 22 in a patterned array may help the durability of stacked IC system 10 in one or more regards. For example, the plurality of electrically conductive pillars 22 may help strengthen the interposer portion 20 thereby providing added structural support for interposer layer 14. As another example, the patterned array of electrically conductive pillars can help improve the reliability of system 10 by reducing mechanical stress on the interposer layer 14 due to differential thermal expansion. Mechanical stress resulting from differential thermal expansion and CTE mismatches within a stacked IC system 10 may lead to physical deformation and causing premature failure modes. A patterned array of electrically conductive pillars 22 may help improve heat dissipation in IC system 10 and/or reduce CTE mismatches between adjacent IC layers 12 and 16. As another example, a top surface of interposer portion 20 may be planarized using chemical mechanical polishing (CMP).

CMP may remove different types of material at different rates. By including a patterned array of electrically conductive pillars 22 in interposer portion 20, more precise control of the CMP process for planarizing the plurality of electrically conductive pillars 22 and filler materials 24, 26 may be achieved.

The plurality of electrically conductive pillars 22 may be formed using any one or more of a variety of techniques, including plating, filling, vapor deposition, or the like. Additionally, the plurality of electrically conductive pillars 22 may be formed from any electrically conductive material including, for example, metals (e.g., copper (Cu), gold (Au), aluminum (Al), silver (Ag), tungsten (W), molybdenum (Mo), or the like), alloys, resins, or the like. In some examples, the plurality of electrically conductive pillars 22 may be formed from semiconductor material including, for example, doped silicon, doped polysilicon, or the like.

Interposer portion 20 may also include an electrically non-conductive filler material 24 that separates and substantially surrounds in the x-y plane each electrically conductive pillar of the plurality of electrically conductive pillars 22. Electrically non-conductive filler material 24 may also provide structural support for interposer layer 14. In some examples, the gap space between adjacent pillars 22 may include only electrically non-conductive filler material 24. By surrounding an electrically conductive pillar of the plurality of electrically conductive pillars 22 with electrically non-conductive filler material 24, the electrically conductive pillar of the plurality of electrically conductive pillars 22 may be electrically isolated from other electrically conductive pillars 22 thereby preventing lateral electrical signals (i.e., in the x-y direction) from being transmitted between the electrically isolated electrically conductive pillar and the other electrically conductive pillars of the plurality of electrically conductive pillars 22. Isolating electrically conductive pillars 22 may allow for electrical signals to be transmitted between IC layers 12 and 16 through the interposer layer 14 using a particular electrically conductive pillar of the plurality of electrically conductive pillars 22. Electrically non-conductive filler material 24 may include any electrically insulating material including for example benzocyclobutene-based polymers, silicon nitride, silicon dioxide, silicon oxycarbide, silicate glass, aluminum oxide, or the like.

In some examples, the interposer portion 20 may also include a second, electrically conductive filler material 26. In some examples, at least some of the plurality of electrically conductive pillars 22 may be substantially surrounded with a relatively thin layer of the first electrically non-conductive filler material 24, and the remainder of the gap filled with the second, electrically conductive filler material 26. The relatively thin layer of non-conductive filler material 24 may electrically isolate the at least some of the plurality of electrically conductive pillars 22 from the second, electrically conductive filler material 26. In some examples, the second, electrically conductive filler material 26 may electrically communicate with one or more of the plurality of electrically conductive pillars 22. Electrically conductive filler material 26 may include any electrically conductive material including, for example, metals (e.g., copper (Cu), gold (Au), aluminum (Al), silver (Ag), tungsten (W), molybdenum (Mo), or the like), alloys, resins, or the like. In some examples, the electrically conductive filler material 26 may be formed from semiconductor material including, for example, doped silicon, doped polysilicon, or the like.

In some examples, the second filler material 26 may form one or more electrical webs 46 within the interposer portion 20 of the interposer layer 14. Electrical webs 46 can be used, for example, to electrically shield components within interposer layer 14 or for signal routing in the horizontal direction within interposer portion 20, which may also facilitate signal routing between the layers 12, 14, or 16 in IC system 10. In some examples, Electrical webs 46 may be formed out of conductive filler material 26 deposited within the gaps between adjacent electrically conductive pillars 22. In some examples electrical webs 46 may be electrically isolated from the plurality of electrically conductive pillars 22 by electrically non-conductive material 24. For example, in some examples, electrical web 46 may contain semiconductor material including, for example, doped silicon, doped polysilicon, or the like, which is isolated from the plurality of electrically conductive pillars 22 using electrically non-conductive filler material 24. In some examples, electrical web 46 may be electrically connected to one or more electrically conductive pillars 22.

In some examples, the interposer layer 14 may contain one or more electrical loops 48. Such electrical loops 48 may be used to electrically isolate and electromagnetically shield components (e.g., IC die 28) contained in interposer layer 14. In some examples, electrical loops 48 form of a continuous loop used to encircle the interposer layer 14 (e.g., about the perimeter of interposer layer 14), IC die 28, or the like. The electrical loops 46 may take on any useful shape including, for example, a serpentine shape. In some examples, the electrical loops 48 may comprise of the same electrically conductive material as the plurality or electrically conductive pillars 22 and may be formed using the same techniques discussed for forming the plurality of electrically conductive pillars 22.

FIG. 2A is a top view conceptual and schematic diagram illustrating and example of a lateral cross section (parallel to the x-y plane of FIG. 1) of an example interposer layer 58 that includes two IC dice 28A, 28B encircled in the x-y plane by an interposer portion 60. Interposer portion 60 includes a plurality of electrically conductive pillars 64 arranged, for example, in a grid-based patterned array. Each electrically conductive pillar of the plurality of electrically conductive pillars 64 is separated from adjacent electrically conductive pillars of plurality of electrically conductive pillars 64 by a gap distance (e.g. $G_x$ and $G_y$ shown in FIG. 2B) such that adjacent electrically conductive pillars of the plurality of electrically conductive pillars 64 do not directly contact one another. For example, FIG. 2B illustrates interposer portion 60 of interposer layer 58, including a plurality of electrically conductive pillars 64 arranged in a grid-based array where each electrically conductive pillar of the plurality of electrically conductive pillars 64 is separated from an adjacent electrically conductive pillar by a gap distance in the x-axis direction ($G_x$), and a gap distance in the y-axis direction ($G_y$). In some examples, the gap distance between adjacent electrically conductive pillars 64 may be on the order of about 10 μm.

While it is not necessary, in some examples, each gap distance $G_x$ in the x-axis direction between subsequent pillars 64 may be substantially equal (e.g., equal or nearly equal) throughout inter poser portion 60 and each gap distance $G_y$ in the y-axis direction between subsequent pillars 64 may be substantially equal (e.g., equal or nearly equal) throughout inter poser portion 60. In some examples, the gap distances in the x-axis direction ($G_x$) and the gap distances in the y-axis direction ($G_y$) may be substantially equal to each other (e.g., $G_x$ equals or nearly equals $G_y$). In this way, in some examples, the gap distance between adjacent pillars of the plurality of electrically conductive pillars 64 is substantially uniform, which can facilitate backfill of filler material 62 and 72 into the gaps between adjacent pillars of the plurality of electrically conductive pillars 64 during formation of interposer portion 60. Additionally or alternatively, in some examples, a uniform gap distance ($G_x$ and $G_y$) may reduce mechanical stress on the IC system (e.g., IC system 10 of FIG. 1) because any dimensional changes associated with thermal expansion or contraction of interposer portion 60 may be substantially uniform in both the x and y directions. In some examples, as described above, by including substantially equal gap distances ($G_x$ and $G_y$), more precise control of a CMP process for planarizing the plurality of electrically conductive pillars 64 and filler materials 62 and 72 may be achieved.

In the example shown in FIG. 2A, IC die 28A and 28B are substantially encircled (e.g., entirely or nearly entirely encircled) by interposer portion 60 in the x-y plane (orthogonal x-, y-, and z-axes are shown in FIG. 2A for purposes of illustration only). With this configuration, when IC layers 12 and 16 are positioned above and below (with respect to the z-axis) interposer layer 58 IC dice 28A and 28B are substantially entirely encapsulated (e.g., entirely encapsulated or nearly entirely encapsulated) within IC system 10. IC dice 28A and 28B thus may not be exposed, such that access to IC dice 28A and 28B may be hindered. In this way, adjacent IC layers 12, 16 and interposer 60 may define a secure boundary for IC dice 28A and 28B that helps prevent access to IC dice 28A and 28B in some examples.

In other configurations, however, IC dice 28A and 28B may only be partially encapsulated within IC system 10. For example, at least one of IC dice 28A or 28B may be positioned proximate to an outer perimeter of interposer layer 58 such that, when IC layers 12 and 16 are positioned above and below (with respect to the z-axis) interposer layer 58, at least a portion of the at least one IC die 28A or 28B is exposed at the perimeter. In these examples, IC layers 12 and 16 may still define a secure boundary for IC dice 28A and 28B because the boundary may still be more secure than if interposer portion 20 was not adjacent to IC die 28A and 28B.

The example interposer layer 58 in FIG. 2A also includes a first filler material 62, which may include an electrically non-conductive material. In some examples, first filler material 62 may be similar to or substantially the same as electrically non-conductive material 24 illustrated and described in FIG. 1. First filler material 62 including an electrically non-conductive material may substantially surround (e.g., surround or nearly surround) IC dice 28A and 28B and some of the plurality of electrically conductive pillars 64 within the interposer layer 58. In this way, first filler material 62 including an electrically non-conductive material may provide electrical isolation for at least some of the plurality of electrically conductive pillars 64 and IC die 28A and 28B as well as structural support for interposer layer 58.

In some examples, interposer portion 60 also may include an electrically conductive material deposited within interposer portion 60 to create one or more electrically conductive loops 70A-70D within interposer layer 58. The electrical loops may include, for example, a continuous electrically conductive loop 70A that encircles interposer layer 58 a continuous electrically conductive loop 70B that encircles IC die 28A, a continuous electrically conductive loop 70C that encircles IC die 28B, and a continuous electrically conductive loop 70D that encircles electrical web 74B. In some examples, at least one of electrical loops 70A-70D may extend throughout the thickness of interposer layer 58 (i.e., in the z-direction) such that the at least one of electrically conductive loops 70A-70D defines a ribbon. Further, at least one of the electrically conductive loops 70A-70D may be electrically connected to a respective electrical contact 42 of one of the adjacent IC layer (e.g., IC layer 12 or 16 of FIG. 1), which may serve to electrically ground the respective electrically conductive loop.

In some examples, electrically conductive loops 70A-70D may electrically isolate and electromagnetically shield (e.g., from electromagnetic interference) the respective components that respective loops of electrically conductive loops 70A-70D encircle. In some examples, the electrically conductive loop, e.g., loop 70D, may serve to electrically isolate portions interposer portion 60 and physically break electrical web 74, thereby creating multiple electrical webs, e.g., webs 74A and 74B, within interposer portion 60.

Electrically conductive loops 70A-70D may take on any shape. In some examples, electrically conductive loops may be circular, rectangular, or polygonal in shape, e.g., loop 70D. In some examples, electrically conductive loops may define a substantially serpentine pattern, e.g., loops 70A-70C, which may be useful in reducing mechanical stress on interposer portion 60 associated with differential thermal expansion. In some examples, the electrically conductive loops 70A-70D may be formed using the same techniques, materials, and at same time that the plurality of electrically conductive pillars 64 are formed. In other examples, the electrically conductive material used to form the electrically conductive loops 70A-70D may be a different material than the plurality of electrically conductive pillars 64.

In some examples, the second, electrically conductive filler material 72 may be deposited so that it forms one or more electrical webs 74A, 74B within interposer portion 60. For example, in some examples, electrically conductive filler material 72 may be deposited within the gaps (e.g., $G_x$ and $G_y$) between adjacent conductive pillars 64 so that electrically conductive filler material 72 forms a connective web, e.g., 74A, within the interposer portion 60.

As shown in FIG. 2A, electrical webs 74 may be electrically insulated from the plurality of electrically conductive pillars 64 by first filler material 62 including an electrically non-conductive material. Electrical webs 74 allow electrical signals to be transmitted laterally, i.e., in the x- and y-axis directions, within interposer layer 58. In some examples, electrical webs 74 may be connected to one or more of the plurality of electrically conductive pillars 64 allowing electrical signals to be transmitted both laterally and vertically (parallel to the z-axis direction) through interposer layer 58 and between adjacent IC layers (e.g. IC layers 12 and 16 of FIG. 1).

In some examples, electrical webs 74 may be electrically isolated from one or more of the adjacent IC layers (e.g., IC layer 12 and 16 from FIG. 1). For example, after the plurality of electrically conductive pillars 64 are formed, interposer portion 60 may be backfilled with the electrically non-conductive filler material 62 to form a thin layer of electrically insulating material around the electrically conductive pillars 64 and on the surface of the lower IC layer (e.g., IC layer 16 from FIG. 1). The remaining gaps between adjacent electrically conductive pillars 64, may then be backfilled with second filler material 72 to establish electrical webs 74.

In other examples, electrical webs 74 may extend substantially through the thickness (i.e., the distance in the z-axis direction of FIG. 2A) of interposer portion 60 and contact adjacent IC layers 12 and 16. In such configurations, conductive material 72 used to form electrical webs 74 may be formed at the same time the plurality of electrically conductive pillars 64 are formed using the same processes. In some examples, electrical web 74 may be directly electrically connected to adjacent IC layers (e.g. IC layers 12 and 16 of FIG. 1).

In some examples, more than one electrical web, e.g., electrical webs 74A and 74B, may be formed within interposer portion 60. Establishing multiple electrical webs 74 within interposer layer 58 may help create additional redundancy features within the IC system. For example, redundant electrical signals may be routed though different areas of interposer portion 60 using the electrically conductive pillars 64, where each area is defined by a different electrical web 74. In this way, if any signal faults or shorts occur within a specific area (e.g., electrically conductive pillar 64 erroneously contacting electrical web 74A), alternative electrical pathways still exist for routing and transmitting the signal.

In some examples, electrical webs 74A and 74B may be separated from one another by the use of non-conductive filler material 62 and the inclusion of one or more electrical loops, e.g., electrical loop 70D. In this way, the non-conductive filler material 62 electrically isolates electrical webs 74 from one another while the electrical loop 70D helps establish an added layer of protection and electrical isolation between neighboring electrical webs 74A and 74B. In some examples (not shown in FIG. 2A.), electrical webs 74A and 74B may be electrically isolated from one another by only non-conductive filler material 62 without the use of electrical loop 70D.

Returning to FIG. 1, while IC system 10 includes three layers (interposer layer 14, and IC layers 12 and 16), systems in accordance with this disclosure may include multiple interposer layers, multiple IC layers, or both. For example, an IC system may include a plurality of interposer layers, each including at least one IC die, with an IC layer positioned in between each interposer layer creating a stacked IC system of alternating IC layers and interposer layers. As yet another example, IC layers 12 and 16 (e.g., layers of the stack that do not include an interposer portion) may comprise multiple sections, instead of being a single, continuous element (as shown in the figures described herein). In some of these examples, voids may exist between the multiple sections and a suitable fill material may be used to fill the voids in order to form a planar surface for stacking of the layers and to ensure electrical connections from an interposer layer to other adjacent layers. In some examples, additional layers may be added to stacked IC system 10 including one or more metals layers, one or more shielding layers, or both.

As described above, interposer portion 20 and IC layers 12 and 16 may physically secure (e.g., substantially encapsulate) IC die 28. Other techniques may be used in addition to at least partially secure a boundary defined by IC layers 12 and 16 and interposer portion 20 to protect IC system 10 from reverse engineering. For example, if IC 28 includes a memory die, the contents of the memory may be encrypted. The at least partially secure physical boundary defined by IC layers 12 and 16 and interposer portion 20 may be an additional layer of security against unauthorized access to the memory contents.

In some examples, stacked IC system 10 may be incorporated into a larger system using any suitable technique. For example, stacked IC system 10 may be incorporated into an IC package, which may provide protection of stacked IC system 10 contained therein against environmental contaminants. In addition, the IC package may provide a thermally conductive pathway for dissipating heat generated by stacked IC system 10 enclosed therein. In some examples, the IC packages may also facilitate mounting of stacked IC system 10 onto a printed board.

In some examples, stacked IC system 10 may be housed in an IC package configured to provide a hermetic housing, which may be useful in some applications to help protect stacked IC system 10 from environmental contaminants. Stacked IC system 10 may also be electrically coupled to a printed board or electrically conductive bond pads in the IC package via any suitable technique, such as via solder balls, conductive pins, solder columns, and the like. In other examples, stacked IC system 10 may be directly mechanically and electrically connected to a printed board, without being disposed in an IC package.

Stacked IC system 10 may be packaged in any suitable manner using any suitable packaging technique known in the art. For example, stacked IC system 10 may be packaged in a package including an electrically conductive material such as aluminum silicon carbide (AlSiC), copper tungsten (CuW), copper molybdenum (CuMo), a nickel cobalt ferrous alloy (e.g., an alloy provided under the trademark Kovar®, made available by Carpenter Technology Corporation of Reading Pennsylvania), or the like. As another example, stacked IC system 10 may be packaged in a package including an electrically insulating ceramic material, such as aluminum oxide, aluminum nitride (AlN), beryllium oxide (BeO), and silicon carbide (SiC). In some examples, stacked IC system 10 may be packaged in a package including materials that are thermally conductive or include a polymeric material, such as a polytetrafluoroethylene (PTFE)/ceramic based laminate (e.g., Rogers RO2800 laminate, which is made commercially available by Rogers Corporation of Rogers, Conn.) or fluoropolymer materials (e.g., fluoropolymers made commercially available by W. L. Gore and Associates of Newark, Del.), FR-4, BT-Epoxy, or polyimide.

Figure 3:
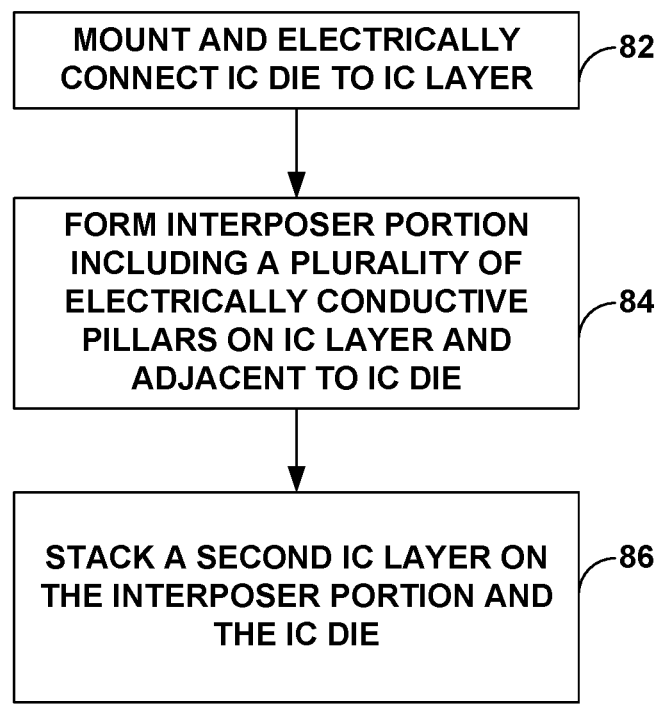
FIG. 3 is a flow diagram illustrating an example technique for forming a stacked integrated circuit system.

Stacked IC system 10 may be made using any number of techniques. FIG. 3 is a flow diagram illustrating an example technique that may be used to form stacked IC system of the disclosure, such as, for example, stacked IC system 10 of FIG. 1. While the technique shown in FIG. 3 is described with respect to stacked IC system 10, in other examples, the technique may be used to form other stacked IC systems that include different configurations of interposer portions or multiple IC dice.

The technique illustrated in FIG. 3 includes mounting IC die 28 to part of a top surface of IC layer 16 such that IC die 28 and IC layer 16 are stacked in a substantially z-axis direction and electrically connected to each other (82). As described above, IC die 28 and IC layer 16 may be electrically coupled using any one or more of a variety of techniques, including wire bonding, flip-chip bonding, direct metal bonding, thermal compression, oxide bonding, or the like. For example, IC layer 16 includes a plurality of electrical contacts 38 positioned on the surface that correspond to and electrically communicate with electrical contacts 36 of IC die 28.

The technique of FIG. 3 also includes forming interposer portion 20 on part of the top surface of IC layer 16 and adjacent to IC die 28 (84). Interposer portion 20 may include a plurality of electrically conductive pillars 22 extending substantially parallel to the z-axis direction, where the plurality of electrically conductive pillars 22 forms a patterned array in an x-y plane on the surface of IC layer 16. As described above, the plurality of electrically conductive pillars 22 may be formed using any one or more of a variety of techniques, including plating, filling, vapor deposition, etching, or the like, until the plurality of electrically conductive pillars 22 extend substantially parallel to the z-axis direction to a sufficient height (e.g., substantially equal to the height of IC die 28 or slightly greater than the height of IC die 28).

In some examples, the plurality of electrically conductive pillars 22 may be formed in a plurality of processing steps which results in the plurality of electrically conductive pillars 22 being formed directly on electrical contacts 42. For example, the exposed surface of IC layer 16 (around IC die 28) may be passivated with a dielectric, such as SiN, then patterned and etched to define a plurality of vias extending through the dielectric to electrical contacts 42. An electrically conductive seed layer (e.g., Cu or Ag) then may be deposited at locations corresponding to the plurality of electrically conductive pillars 22 as a base for the plurality of electrically conductive pillars 22. The plurality of electrically conductive pillars 22 then may be grown upward in the z-axis direction using for example, electroplating, until the pillars reach a desired height, such as the height of IC die 28 or a height slightly greater than the height of IC die 28. In some examples, the plurality or electrically conductive pillars 22 form a patterned array defining gaps between each of the pillars.

In some examples, forming interposer portion 20 including a plurality of electrically conductive pillars 22 (84) may also include backfilling gaps between adjacent ones of the plurality of electrically conductive pillars 22 with a filler material (e.g., electrically non-conductive material 24, electrically conductive material 26, or both) so that the filler material substantially encircles each of the plurality of electrically conducting pillars 22 in the x-y plane. The backfilling process may be accomplished by, for example, depositing the filler material using chemical vapor deposition (CVD). As described above, the filler material may include an electrically non-conductive material 24 used to electrically isolate certain electrically conductive pillars from the remainder of the plurality of electrically conductive pillars 22, may include an electrically conductive material 26 that may be used to create an electrical web 46 within the interposer portion 20 or to electrically connect two or more electrically conductive pillars from the plurality of electrically conductive pillars 22, or both. In some examples, the backfilling process can be done in multiple steps, selectively depositing either electrically non-conductive material 24 or electrically conductive material 26, such that electrical webs 46 may be created within interposer portion 20 of interposer layer 14.

In some examples, electrical loops 48 formed within interposer layer 14 using an electrically conductive material. In some examples, the electrical loops 48 may be formed using the same techniques and at the same time that the plurality of electrically conductive pillars 22 are formed. In some examples, the electrical loops 48 may be formed after the plurality of electrically conductive pillars 22 are formed by, for example, backfilling the space between adjacent electrically conductive pillars 22 with an electrically conductive filler, e.g, filler material 26, so that multiple electrically conductive pillars 22 are connected to establish the electrical loop 48. The electrical loops 48 may encircle components in interposer layer 14 (e.g., IC die 28) to establish an electrical loop (e.g., a serpentine loop) that may aid in electrically shielding the encircled component.

In other examples, forming interposer portion 20 including a plurality of electrically conductive pillars 22 (84) may include first forming one or more layers of filler material (e.g., electrically non-conductive material 24 on the surface of IC layer 16 to reach a desired height (e.g., the height of IC die 28 or a height slightly greater than the height of IC die 28). Each layer of filler material may be formed using any suitable process, including, for example, chemical vapor deposition (CVD), physical vapor deposition (PVD), or the like. Once a layer of the filler material has been formed, apertures or vias that correspond to the plurality of electrically conductive pillars 22 can be patterned and etched into the filler material using, for example, an etchant that selectively etches the filler material but does not etch the underlying material at the surface of IC layer 16. For example, the patterned etching may be conducted using buffered hydrofluoric acid (BHF; a mixture of a buffering agent such as ammonium fluoride (NH4F) and hydrofluoric acid (HF)) or dry plasma etching techniques. After the apertures or vias have been etched, the vias or apertures can be filled with a conductive material (e.g., Cu or Ag) to form the plurality or electrically conductive pillars 22. The conductive material may be deposited using any suitable process, including, for example, chemical vapor deposition (CVD), electroplating, or the like. The resulting structure then may be planarized using, for example, CMP.

In some examples, the electrical webs (e.g., web 46 of FIG. 1 or webs 74 of FIG. 2) and electrical loops (e.g., loop 48 of FIG. 1 or loops 70A-70D of FIG. 2) may be formed in a similar method to the plurality of electrically conductive pillars 22. For example, after a layer of non-conductive material 24 is formed, the layer can be pattern etched to create both apertures and/or trenches that correspond to the electrical web 46, and electrical loop 48. The apertures and trenches then may be backfilled with electrically conductive material (e.g. electrically conductive material 26). The patterned etching may be done in a single stage or multiple stages with or without backfilling between each stage. For example, a layer of electrically non-conductive material 24 may be etched first to form the trenches and backfilled with electrically conductive material 26. After the trenches are backfilled, the surface can be remasked and etched to form the apertures for the plurality of electrically conductive pillars 22 and electrical loop 48. In some examples, the electrically conductive material that makes up the plurality of electrically conductive pillars 22 and the conductive filler material 26 is the same, and, in other examples, the material may be different.

During the formation of the interposer portion 20 (84), one or more of the plurality of electrically conductive pillars 22 may be electrically coupled with IC layer 16. For example, electrically conductive vias 32 present in IC layer 16 may be electrically connected to the plurality of electrically conductive pillars 22 of the interposer portion 20 by way of electrical contacts 42 positioned along the surface of IC layer 16 and metal bonded to the plurality of electrically conductive pillars 22. In this way, in some examples, IC die 28 may be in electrical communication with the plurality of electrically conductive pillars 22 by way of traces 34 and vias 32, 40 present in IC layer 16.

The technique illustrated in FIG. 3 also includes stacking a second IC layer 12 on interposer portion 20 and IC die 28 (86). During stacking, the second IC layer 12 may be coupled to interposer portion 20 electrically, mechanically, or both, using any suitable technique, including adhesive bonding, metal bonding, solder bonding, or the like. For example, respective electrically conductive vias 32 present in IC layer 12 may be electrically connected to respective ones of the plurality of electrically conductive pillars 22 of interposer portion 20 by way of electrical contacts 42 positioned along the surface of IC layer 12, adjacent to interposer layer 14 and metal bonded to the plurality of electrically conductive pillars 22. Also as described above, in some examples, IC die 28 may be bonded to IC layer 12 using an adhesive bond 50 for added mechanical security.

In some examples, the technique illustrated in FIG. 3 may also include one or more planarization steps. For example, after interposer portion 20 is formed, a surface opposite the interface between IC layer 16 and interposer portion 20 may be planarized using for example, CMP. IC layer 12 can then be stacked on the planarized surface and configured to electrically communicate with the plurality of electrically conductive pillars 22 (86).

Various examples have been described. These and other examples are within the scope of the following claims.

What is claimed is:

1. A system comprising:
a first integrated circuit layer comprising a first plurality of interconnect elements;
a second integrated circuit layer comprising a second plurality of interconnect elements; and
an interposer layer between the first and second integrated circuit layers, wherein the first and second integrated circuit layers and the interposer layer are stacked in a z-axis direction, and wherein the interposer layer comprises:
an interposer portion comprising a filler material and a plurality of electrically conductive pillars extending in the z-axis direction, wherein the plurality of electrically conductive pillars form a patterned array in an x-y plane substantially normal to the z-axis direction, wherein each electrically conductive pillar of the plurality of electrically conductive pillars is substantially encircled in the x-y plane by the filler material, wherein at least one electrically conductive pillar of the plurality of electrically conductive pillars is configured to electrically communicate with at least one interconnect element of the first plurality of interconnect elements and at least one interconnect element of the second plurality of interconnect elements, wherein the filler material comprises an electrically conductive material positioned within gaps between the plurality of electrically conductive pillars, wherein the electrically conductive material forms at least one electrical web within the x-y plane of the interposer portion; and
a first integrated circuit die adjacent to the interposer portion and between the first and second integrated circuit layers.

2. The system of claim 1, wherein the interposer portion substantially encircles the first integrated circuit die in the x-y plane, and wherein the patterned array of the plurality of electrically conductive pillars substantially surrounds the first integrated circuit die.

3. The system of claim 1, wherein the patterned array of the plurality of electrically conductive pillars comprises a grid having an x-separation distance between adjacent electrically conductive pillars and a y-separation distance between adjacent electrically conductive pillars, and wherein the x-separation distance and the y-separation distance are about 10 μtm.

4. The system of claim 1, wherein the filler material further comprises at least one electrically non-conductive material comprising at least one of benzocyclobutene-based polymers, silicon dioxide, silicon nitride, or aluminum oxide.

5. The system of claim 1, wherein the electrically conductive material comprises a semiconductor material.

6. The system of claim 1, wherein the interposer portion encircles the first integrated circuit die, wherein the at least one electrical web forms a first electrical pathway that encircles the first integrated circuit die within the x-y plane of the interposer portion, and wherein the interposer portion further comprises an electrical loop comprising at least some of the plurality of electrically conductive pillars, the electrical loop forming a second electrical pathway that encircles the first integrated circuit die within the x-y plane of the interposer portion.

7. The system of claim 6, wherein the electrical loop comprises a serpentine shape.

8. The system of claim 1, wherein the plurality of electrically conductive pillars have a substantially similar sized lateral cross-sectional dimension.

9. The system of claim 8, the lateral cross-sectional dimension of the plurality of electrically conductive pillars is about 30 μm.

10. The system of claim 1, wherein the plurality of electrically conductive pillars comprises at least one of semiconductor material, copper, or gold.

11. The system of claim 2, wherein:
the interposer layer further comprises a second integrated circuit die adjacent to the interposer portion and between the first and second integrated circuit layers;
the second integrated circuit die is electrically connected to at least one interconnect element of the first plurality of interconnect elements,
the interposer portion substantially encircles the second integrated circuit die in the x-y plane; and
the patterned array of the plurality of electrically conductive pillars substantially surrounds the second integrated circuit die.

12. A method comprising:
mounting a first integrated circuit die on a top surface of a first integrated circuit layer, wherein the first integrated circuit layer comprises a first plurality of interconnect elements, wherein the first integrated circuit die and the first integrated circuit layer are stacked in a z-axis direction, and wherein the first integrated circuit die electrically communicates with the first integrated circuit layer;
forming an interposer portion on an exposed part of the top surface of the first integrated circuit layer adjacent to the first integrated circuit die, wherein the interposer portion comprises a plurality of electrically conductive pillars extending in the z-axis direction, wherein the plurality of electrically conductive pillars form a patterned array in an x-y plane substantially normal to the z-axis direction, wherein each electrically conductive pillar of the plurality of electrically conductive pillars is substantially encircled in the x-y plane by a filler material, wherein the filler material comprises an electrically conductive material positioned within gaps between the plurality of electrically conductive pillars, wherein the electrically conductive material forms at least one electrical web within the x-y plane of the interposer portion; and
stacking a second integrated circuit layer on the interposer portion, wherein the second integrated circuit layer comprises a second plurality of interconnect elements, wherein the first and second integrated circuit layers are substantially parallel to each other and the first integrated circuit die is between the first and second integrated circuit layers, wherein at least one electrically conductive pillar of the plurality of electrically conductive pillars is configured to electrically communicate with at least one interconnect element of the first plurality of interconnect elements and at least one interconnect element of the second plurality of interconnect elements.

13. The method of claim 12, wherein the interposer portion substantially encircles the first integrated circuit die, and wherein the patterned array of the plurality of electrically conductive pillars substantially surrounds the first integrated circuit die.

14. The method of claim 12, wherein the filler material further comprises an electrically non-conductive material comprising at least one of benzocyclobutene-based polymers, silicon dioxide, silicon nitride, or aluminum oxide.

15. The method of claim 14, wherein the interposer portion encircles the first integrated circuit die, wherein the at least one electrical web forms a first electrical pathway that encircles the first integrated circuit die within the x-y plane of the interposer portion, and wherein forming an interposer portion further comprises forming the at least one electrical loop that comprises at least some of the plurality of electrically conductive pillars and forms a second electrical pathway encircling the first integrated circuit die within the x-y plane.

16. The method of claim 15, wherein the electrical loop comprises a serpentine shape.

17. The method of claim 15, wherein the electrical loop and the plurality of electrically conductive pillars are formed at the same time.

18. The method of claim 12, wherein the plurality of electrically conductive pillars have a substantially similar sized lateral cross-sectional dimension, wherein the patterned array of the plurality of electrically conductive pillars comprises a grid having an x-separation distance between adjacent electrically conductive pillars and a y-separation distance between adjacent electrically conductive pillars, wherein the x-separation distance and the y-separation distance are substantially uniform throughout the patterned array of the plurality of electrically conductive pillars, and wherein the x-separation distance and the y-separation distance are substantially equal.

19. The system of claim 1, wherein the at least one electrical web is electrically isolated from the plurality of electrically conductive pillars.

20. The method of claim 12, wherein the at least one electrical web is electrically isolated from the plurality of electrically conductive pillars.

* * * * *